(12) United States Patent
Sumakeris et al.

(10) Patent No.: US 8,430,960 B2
(45) Date of Patent: Apr. 30, 2013

(54) DEPOSITION SYSTEMS AND SUSCEPTOR ASSEMBLIES FOR DEPOSITING A FILM ON A SUBSTRATE

(75) Inventors: Joseph John Sumakeris, Apex, NC (US); Michael James Paisley, Garner, NC (US); Michael John O'Loughlin, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 845 days.

(21) Appl. No.: 11/512,800

(22) Filed: Aug. 29, 2006

(65) Prior Publication Data

US 2007/0101939 A1    May 10, 2007

Related U.S. Application Data

(62) Division of application No. 10/414,787, filed on Apr. 16, 2003, now Pat. No. 7,118,781.

(51) Int. Cl.
| | |
|---|---|
| *C23C 16/455* | (2006.01) |
| *C23C 16/458* | (2006.01) |
| *C23C 16/46* | (2006.01) |
| *C23C 16/507* | (2006.01) |
| *C23F 1/00* | (2006.01) |
| *H01L 21/306* | (2006.01) |
| *C23C 16/06* | (2006.01) |
| *C23C 16/22* | (2006.01) |

(52) U.S. Cl.
USPC ...... 118/715; 118/724; 118/725; 156/345.33; 156/345.34; 156/345.37; 156/345.48; 156/345.52

(58) Field of Classification Search .......... 118/715, 118/724, 725; 156/345.33, 345.34, 345.37, 156/345.48, 345.52
See application file for complete search history.

(56) References Cited

U.S. PATENT DOCUMENTS

| | | | | |
|---|---|---|---|---|
| 2,759,855 A | * | 8/1956 | Medcalf et al. | ............... 257/41 |
| 4,748,135 A | | 5/1988 | Frijlink | ....................... 437/102 |

(Continued)

FOREIGN PATENT DOCUMENTS

| | | |
|---|---|---|
| EP | 0 959 150 A2 | 11/1999 |
| JP | 53 126867 A | 11/1978 |

(Continued)

OTHER PUBLICATIONS

Handbook of Chemistry and Physics—Web Edition, (STIC NPL).*

(Continued)

*Primary Examiner* — Rudy Zervigon
(74) *Attorney, Agent, or Firm* — Myers Bigel Sibley & Sajovec, PA

(57) ABSTRACT

Parasitic deposits are controlled in a deposition system for depositing a film on a substrate, the deposition system of the type defining a reaction chamber for receiving the substrate and including a process gas in the reaction chamber and an interior surface contiguous with the reaction chamber. Such control is provided by flowing a buffer gas between the interior surface and at least a portion of the process gas to form a gas barrier layer such that the gas barrier layer inhibits contact between the interior surface and components of the process gas. A deposition system for depositing a film on a substrate using a process gas includes a reaction chamber adapted to receive the substrate and the process gas. The system further includes an interior surface contiguous with the reaction chamber. A buffer gas supply system is adapted to supply a flow of a buffer gas between the interior surface and at least a portion of the process gas such that the flow of the buffer gas forms a gas barrier layer to inhibit contact between the interior surface and components of the process gas when the process gas is disposed in the reaction chamber.

40 Claims, 3 Drawing Sheets

U.S. PATENT DOCUMENTS

| | | | |
|---|---|---|---|
| 4,756,927 A | 7/1988 | Black et al. | |
| 4,778,693 A | 10/1988 | Drozdowicz et al. | |
| 4,800,105 A * | 1/1989 | Nakayama et al. | 427/253 |
| 4,924,807 A | 5/1990 | Nakayama et al. | 118/725 |
| 4,989,541 A | 2/1991 | Mikoshiba et al. | |
| 5,005,519 A | 4/1991 | Egermeier et al. | |
| 5,027,746 A | 7/1991 | Frijlink | 118/724 |
| 5,085,727 A * | 2/1992 | Steger | 156/345.47 |
| 5,108,540 A | 4/1992 | Frijlink | 156/612 |
| 5,334,277 A | 8/1994 | Nakamura | 117/102 |
| 5,433,169 A | 7/1995 | Nakamura | 117/102 |
| 5,449,535 A | 9/1995 | Streater | |
| 5,620,524 A | 4/1997 | Fan et al. | |
| 5,669,976 A | 9/1997 | Yuuki et al. | |
| 5,674,320 A | 10/1997 | Kordina et al. | 118/500 |
| 5,695,567 A | 12/1997 | Kordina et al. | 118/725 |
| 5,704,985 A | 1/1998 | Kordina et al. | 118/725 |
| 5,759,263 A | 6/1998 | Nordell et al. | 117/98 |
| 5,792,257 A | 8/1998 | Kordina et al. | 117/90 |
| 5,851,589 A | 12/1998 | Nakayama et al. | 427/248.1 |
| 5,879,462 A | 3/1999 | Kordina et al. | 118/725 |
| 6,030,661 A | 2/2000 | Kordina et al. | 427/248.1 |
| 6,039,812 A | 3/2000 | Ellison et al. | 118/725 |
| 6,048,398 A | 4/2000 | Vehanen et al. | 117/200 |
| 6,093,253 A | 7/2000 | Löfgren et al. | 118/725 |
| 6,179,913 B1 | 1/2001 | Solomon et al. | |
| 6,299,683 B1 * | 10/2001 | Rupp et al. | 117/88 |
| 6,306,216 B1 * | 10/2001 | Kim et al. | 118/725 |
| 6,402,849 B2 | 6/2002 | Kwag et al. | |

FOREIGN PATENT DOCUMENTS

| | | |
|---|---|---|
| JP | 59209643 A | 5/1983 |
| JP | 06-338466 | 12/1994 |
| JP | 2002 170774 A | 6/2002 |
| WO | WO 98/44164 A | 10/1998 |
| WO | WO 02/38839 A1 | 5/2002 |

OTHER PUBLICATIONS www.omega.com.*

International Search Report and Written Opinion of the International Searching Authority for Application No. PCT/US2004/004943 mailed on May 11, 2005.

Notice of Rejection issued Mar. 16, 2010 during examination of the corresponding Japanese Patent Application No. 2006-508772.

Partial European Search Report, European Application No. EP 10176491.8, dated Oct. 19, 2010 (5 pages).

York et al., "Ultraviolet laser-assisted metalorganic chemical vapor deposition of GaAs" Journal of Applied Physics, American Institute of Physics, New York, 66(10):5001-5008 (Nov. 15, 1989).

* cited by examiner

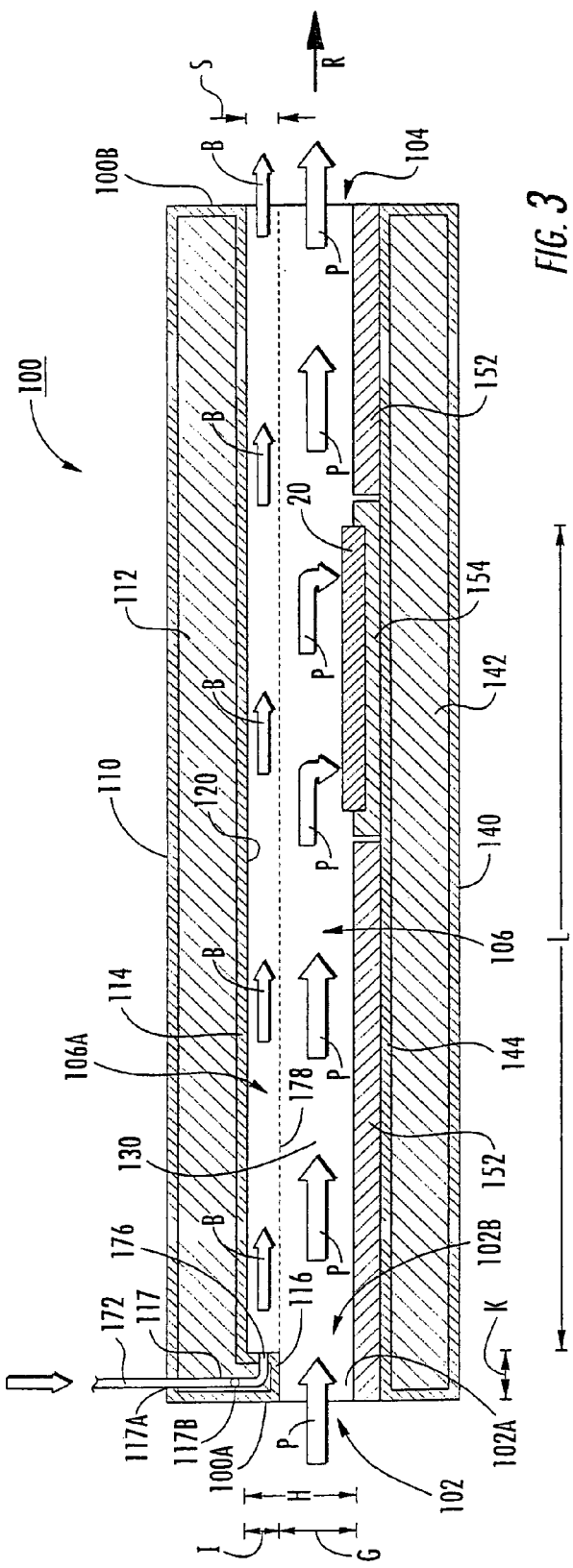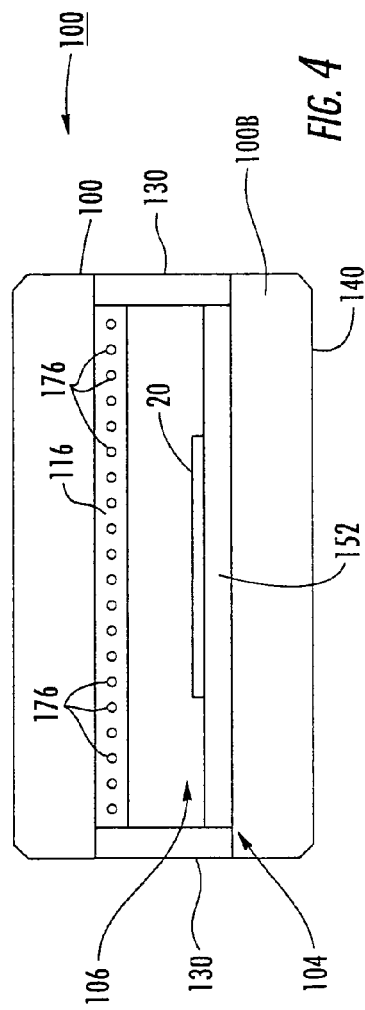

DEPOSITION SYSTEMS AND SUSCEPTOR ASSEMBLIES FOR DEPOSITING A FILM ON A SUBSTRATE

RELATED APPLICATION(S)

This is a divisional patent application of U.S. patent application Ser. No. 10/414,787, filed Apr. 16, 2003, now U.S. Pat. No. 7,118,781 the disclosure of which is hereby incorporated herein by reference in its entirety

STATEMENT OF GOVERNMENT SUPPORT

The present invention was made with Government support under Office of Naval Research Contract No. N00014-02-C-0302 awarded by the Office of Naval Research. The Government has certain rights in this invention.

FIELD OF THE INVENTION

The present invention relates to deposition processes and apparatus and, more particularly, to methods and apparatus for depositing a film on a substrate.

BACKGROUND OF THE INVENTION

Deposition systems and methods are commonly used to form layers such as relatively thin films on substrates. For example, a chemical vapor deposition (CVD) reactor system and process may be used to form a layer of semiconductor material such as silicon carbide (SiC) on a substrate. CVD processes may be particularly effective for forming layers with controlled properties, thicknesses, and/or arrangements such as epitaxial layers. Typically, in a deposition system, such as a CVD system, the substrate is placed in a chamber and a process gas including reagents or reactants to be deposited on the substrate is introduced into the chamber adjacent the substrate. The process gas may be flowed through the reaction chamber in order to provide a uniform or controlled concentration of the reagents or reactants to the substrate. Undesirably, the reagents or reactants may tend to deposit on interior surfaces of the reaction chamber as well. Such deposits may be referred to as "parasitic" deposits because they remove reagents or reactants from the process.

With reference to FIG. 5, an exemplary conventional deposition system 40 is shown therein and illustrates the process by which deposits may be formed on unintended surfaces of a reaction chamber. The system 40 is, for example, a flow through, hot wall, CVD reactor. The system 40 has a top susceptor member 42 and a bottom susceptor member 44. The system 40 also has a top liner 43 and a bottom liner 45 defining a reaction chamber 47 therebetween. A substrate 20, such as a wafer, is positioned in the reaction chamber 47 and may be situated on an interior surface of a platter (which may rotate), for example. A process gas is introduced to the reaction chamber 47 at one end, flowed through the reaction chamber 47 past the substrate 20, and finally exhausted from the reaction chamber 47 at the opposite end. As indicated by the arrows in the reaction chamber 47 as shown in FIG. 5, as the process gas flows through the reaction chamber 47 a portion of the process gas may contact the substrate 20 as intended and thereby deposit the reagents or reactants on the substrate 20 to form a layer thereon. However, as indicated by the arrows, a portion of the process gas also contacts an interior surface or ceiling 46 of the top liner 43 as well as interior surfaces of the bottom liner 45 and side walls. As a result, parasitic deposits 50 and 52 of the reagents or reactants from the process gas tend to form on the ceiling 46 and the bottom liner 45, respectively, as well as on the sidewalls. The parasitic deposits on the ceiling 46 may be particularly harmful because they may dislodge and fall onto the substrate 20 during processing, reducing the quality of the formed layer. Moreover, the changing amount of the parasitic deposits may introduce undesirable variations in temperature and gas flow dynamics, thereby influencing the growth of the layer on the substrate 20. Depletion of the process gas because of the formation of the parasitic deposits may tend to waste reactants, thereby reducing efficiency and growth rate.

Typically, the deposition process is managed to accommodate the formation of parasitic deposits. The cumulative growth time may be limited to reduce the impact of parasitic deposits on product material. After a set time, the susceptor may be cleaned and reconditioned before more production growth runs are attempted. This procedure may limit both the possible length of any single growth run and the number of runs of shorter duration between cleaning cycles. Despite such efforts, parasitic deposits may nonetheless negatively impact product material due to particle formation, process variability and reduced reactant utilization efficiency.

SUMMARY OF THE INVENTION

According to embodiments of the present invention, parasitic deposits are controlled in a deposition system for depositing a film on a substrate, the deposition system of the type defining a reaction chamber for receiving the substrate and including a process gas in the reaction chamber and an interior surface contiguous with the reaction chamber. Such control is provided by flowing a buffer gas to form a gas barrier layer between the interior surface and at least a portion of the process gas such that the gas barrier layer inhibits contact between the interior surface and components of the process gas.

According to further embodiments of the present invention, a deposition system for depositing a film on a substrate using a process gas includes a reaction chamber adapted to receive the substrate and the process gas. The system further includes an interior surface contiguous with the reaction chamber. A buffer gas supply system is adapted to supply a flow of a buffer gas between the interior surface and at least a portion of the process gas such that the flow of the buffer gas forms a gas barrier layer to inhibit contact between the interior surface and components of the process gas when the process gas is disposed in the reaction chamber.

According to yet further embodiments of the present invention, a deposition control system is provided for controlling parasitic deposits in a deposition system for depositing a film on a substrate, the deposition system of the type defining a reaction chamber for holding the substrate and including a process gas in the reaction chamber and an interior surface contiguous with the reaction chamber. The deposition control system includes a buffer gas supply system adapted to provide a flow of a buffer gas between the interior surface and at least a portion of the process gas such that the flow of the buffer gas forms a gas barrier layer to inhibit contact between the interior surface and components of the process gas.

According to further embodiments of the present invention, a deposition system for depositing a film on a substrate includes a reaction chamber adapted to receive the substrate and an interior surface contiguous with the reaction chamber. A process gas is disposed within the reaction chamber. A flow of a buffer gas is disposed between the interior surface and at least a portion of the process gas. The flow of the buffer gas forms a gas barrier layer to inhibit contact between the interior surface and components of the process gas.

According to further embodiments of the present invention, a susceptor assembly for depositing a film on a substrate using a process gas and a buffer gas each flowed in a flow direction includes at least one susceptor member. The at least one susceptor member defines a reaction chamber, a process gas inlet and a buffer gas inlet. The reaction chamber is adapted to receive the substrate and has a buffer gas region to receive the buffer gas. The reaction chamber has a first cross-sectional area perpendicular to the flow direction. The process gas inlet has a second cross-sectional area perpendicular to the flow direction. The second cross-sectional area is less than the first cross-sectional area. The buffer gas inlet is adjacent the process gas inlet and is adapted to direct the buffer gas into the buffer gas region of the reaction chamber.

BRIEF DESCRIPTION OF THE DRAWINGS

FIG. 3 is a cross-sectional view of the susceptor assembly of FIG. 2 taken along the line 3-3 of FIG. 2, wherein a buffer gas supply line, a substrate, a flow of buffer gas and a flow of process gas are also shown;

FIG. 4 is a rear end elevational view of the susceptor assembly of FIG. 2 and the substrate.

DETAILED DESCRIPTION OF THE PREFERRED EMBODIMENTS

Figure 1:
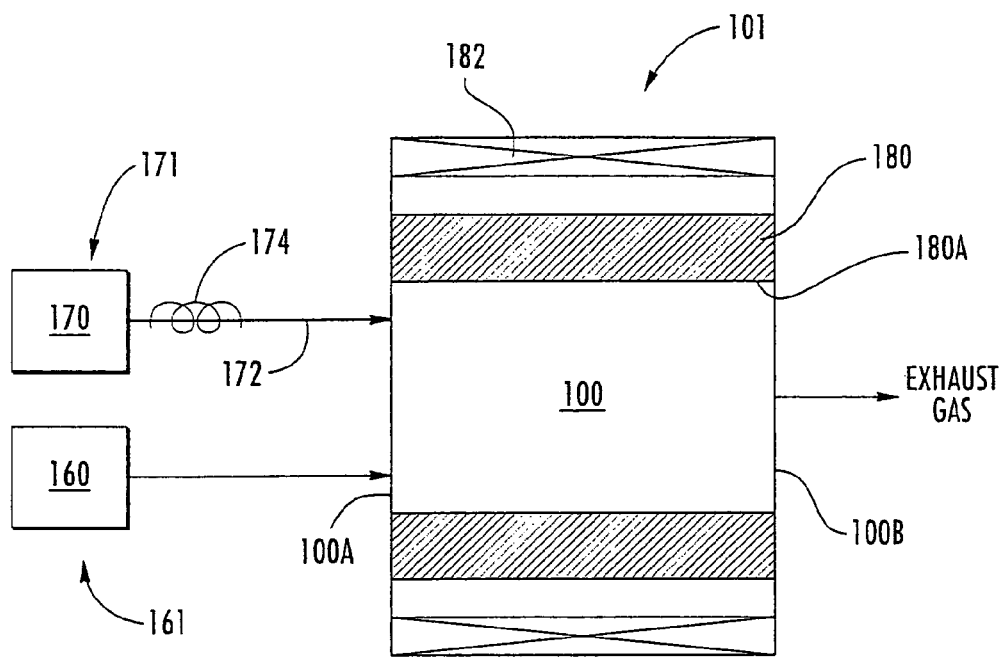
FIG. 1 is a schematic view of a deposition system according to embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions or layers may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present.

With reference to FIG. 1, a deposition system 101 according to embodiments of the present invention is schematically shown therein. The deposition system 101 may be a horizontal, hot wall, flow through, CVD system as shown including a susceptor assembly 100, a quartz tube 180 defining a through passage 180A, an electromagnetic frequency (EMF) generator 182 (for example, including a power supply and an RF coil surrounding the tube 180) and a process gas supply system 161. An insulative cover may be provided about the susceptor assembly 100 in addition to or in place of the quartz tube 180. The deposition system 101 further includes a buffer gas supply system 171 in accordance with the present invention. The deposition system 101 may be used to form a layer or film on a substrate 20 (FIG. 3). While only a single substrate 20 is illustrated in FIGS. 3 and 4, the system 101 may be adapted to form films concurrently on multiple substrates 20.

The substrate 20 may be a wafer or other structure formed of the same or a different material than that of the layer to be deposited. The substrate 20 may be formed of, for example, SiC, sapphire, a Group III nitride, silicon, germanium, and/or a III-V or II-VI compound or interalloy, or the like. The substrate surface upon which the film is deposited may be a base substrate or a first or subsequent layer superimposed on a base substrate. For example, the surface of the substrate 20 for receiving the deposited film may be a layer previously deposited using the deposition system 101 or an alternative apparatus. As will be appreciated by those of skill in the art in light of the present disclosure, embodiments of the present invention may be advantageously utilized with semiconductor materials other than those specifically mentioned herein. As used herein, the term "Group III nitride" refers to those semiconducting compounds formed between nitrogen and the elements in Group IIIA of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

Generally, the process gas supply system 161 supplies a process gas into and through the susceptor assembly 100 as discussed below. The EMF generator 182 inductively heats the susceptor assembly 100 to provide a hot zone in the susceptor assembly 100 where deposition reactions take place. The process gas continues through and out of the susceptor assembly 100 as an exhaust gas which may include remaining components of the process gas as well as reaction by-products, for example. Embodiments of the present invention may be used in types of deposition systems other than hot wall CVD systems. Other modifications to the systems and methods of the present invention will be apparent to those of ordinary skill in the art upon reading the description herein.

The process gas supply system 161 includes a supply 160 of the process gas. The process gas includes one or more components such as reagents, reactants, species, carriers and the like. One or more of these components may be capable, alone or in combination with one or more other components (which may also be present in the process gas), of forming deposits on a surface such as the ceiling or interior surface 120 (FIG. 3). Exemplary components that may form or assist in forming deposits upon contacting the ceiling surface 120 include $SiH_4$, $C_3H_8$, $C_2H_4$, $Si_2H_6$, $SiCl_4$, $SiH_2Cl_2$, $SiCl_3(CH_3)$, $NH_3$, trimethyl gallium, and trimethyl aluminum. Where it is desired to form a SiC layer on a substrate, the process gas may include precursor gases such as silane ($SiH_4$) and propane ($C_3H_8$) along with a carrier gas such as purified hydrogen gas ($H_2$). The process gas supply 160 may be provided from one or more pressurized containers of the gases with flow control and/or metering devices as needed. The process gas may be adapted to deposit a layer of SiC, a Group III nitride, silicon, germanium, and/or a III-V and/or II-VI compound or interalloy on the substrate 20.

The buffer gas supply system 171 includes a supply 170 of a buffer gas fluidly connected to the susceptor assembly 100 by a line 172. The buffer gas supply 170 may be provided from one or more pressurized canisters of the gas or gases with flow control and/or metering devices as needed. A heater 174 may be provided along the line 172, in or at the susceptor assembly 100, or at the buffer gas supply 160 for preheating the buffer gas.

The buffer gas may be any suitable gas. According to some embodiments, the buffer gas is a gas having relatively low diffusion rates for many or selected ones of the species or components present in the process gas. According to some embodiments, the buffer gas is a noble gas. The noble gas may include argon, helium, neon, krypton, radon, or xenon. Other suitable gases include $H_2$, $N_2$, $NH_3$ or air. The buffer gas may include or be substantially composed of a species capable of chemically assisting in removing or inhibiting deposits of reactants from the process gas. For example, in accordance with some embodiments and particularly in the case of a process for growing a layer of SiC on a substrate, the buffer gas includes an etchant such as HCl, $Cl_2$ and/or a carbon-containing gas such as propane.

Figure 2:
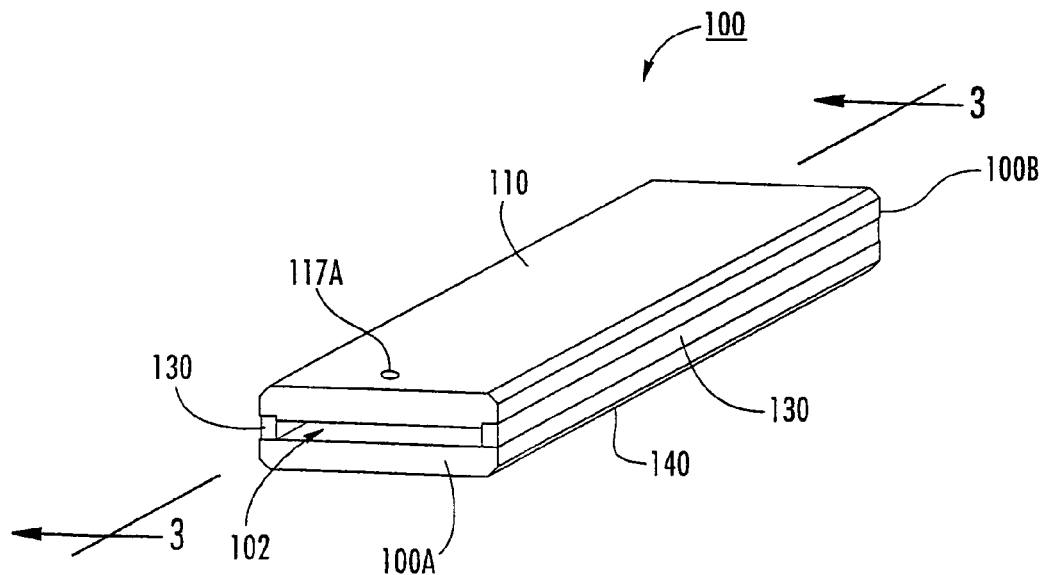
FIG. 2 is a perspective view of a susceptor assembly forming a part of the deposition system of FIG. 1.
Figure 5:
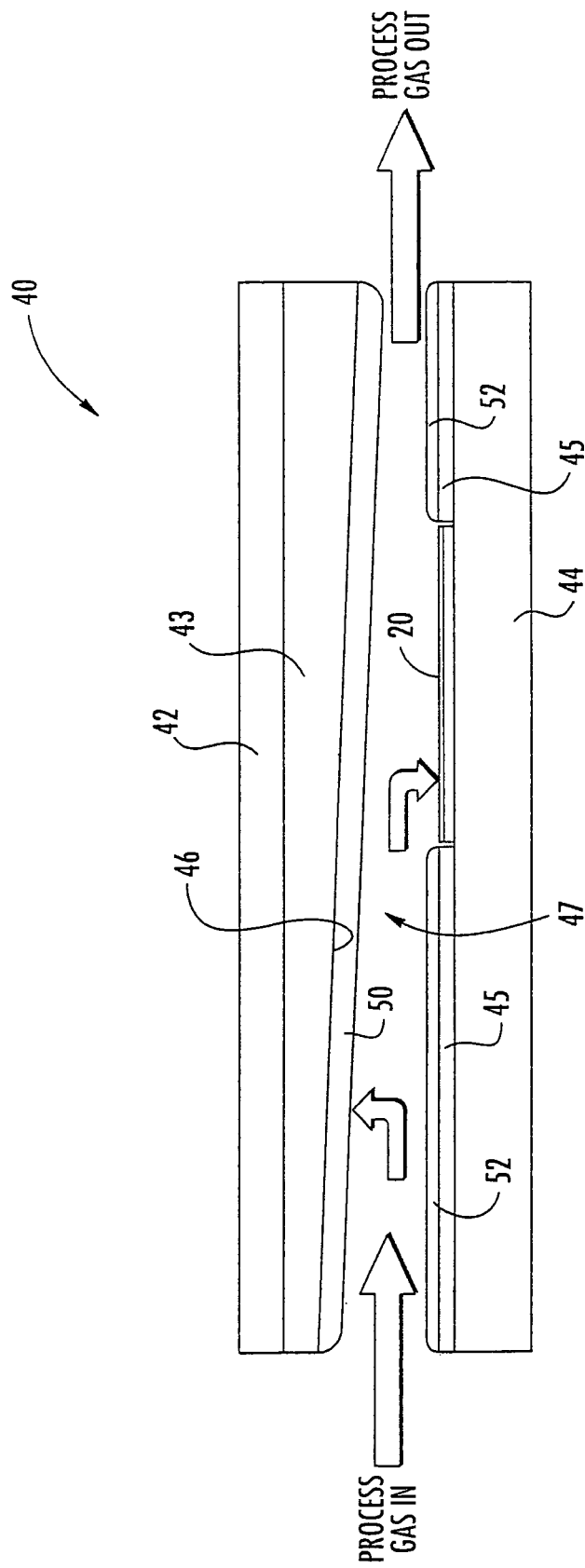
FIG. 5 is a schematic view of a conventional deposition system.

Turning to the susceptor assembly 100 in greater detail and with reference to FIGS. 2 to 4 the susceptor assembly 100 includes a top member 110, a pair of side members 130, and a bottom member 140. The susceptor assembly 100 extends from an entrance end 100A to an exit end 100B. The members 110, 130, 140 define an entrance opening 102 (at the end 100A) and an exit opening 104 (at the end 100B). The members 110, 130, 140 also define a reaction chamber 106 extending from a process gas inlet 102B to the opening 104. According to some embodiments, the reaction chamber 106 has a length of between about 0.1 and 1 meter, a width of between about 0.05 and 0.5 meter, and a height of between about 1 and 10 cm.

The top member 110 includes a core or susceptor body 112 covered (and preferably substantially fully surrounded) by a layer 114. The layer 114 includes the ceiling or interior surface 120 facing and contiguous with the reaction chamber 106.

The core 112 is preferably formed of a susceptor material suitable to generate heat responsive to eddy currents generated therein by the EMF generator 182, Such materials and inductive heating arrangements being well known to those of skill in the art. The core 112 may be formed of graphite, and more preferably of high purity graphite.

The layer 114 may be formed of a material having high purity and which is able to withstand the process temperatures (typically in the range of 1500 to 1800° C. for SiC deposition). The layer 114 may be formed of, for example, SiC or a refractory metal carbide such as TaC, NbC and/or TiC. The layer 114 may be applied to the core 112 by any suitable method. Preferably, the layer 114 is a dense, impervious coating and has a thickness of at least about 10 μm, and more preferably, between about 20 μm and 100 μm.

The top member 110 further includes a downwardly stepped portion 116 adjacent the opening 102. The stepped portion 116 and the underlying portion of the liner 152 define the process gas inlet 102B and a process gas inlet passage 102A extending from the opening 102 to the process gas inlet 102B. The step portion 116 also defines a buffer gas region 106A (FIG. 3) in the upper portion of the reaction chamber 106.

A plurality of passages 117 (one shown in FIG. 3) extend through the top member 110 and terminate at a respective port 176 (see FIGS. 3 and 4). A common feed inlet 117A (FIGS. 2 and 3) is provided for connecting the buffer gas line 172 to the passages 117 which may be interconnected in a manifold arrangement by a lateral passage 117B (FIG. 3). Alternatively, separate lines and/or inlets may be provided for some or each of the ports 176. The passages 117, the inlet 117A and the ports 176 may be formed in the top member 110 by any suitable method such as drilling or molding.

The bottom member 140 includes a core 142 covered by a coating or layer 144. Suitable materials and methods for forming the core 142 and the layer 144 are as described above for the core 112 and the layer 114. The side members 130 similarly include respective cores (not shown) and covering layers which may be formed of the same materials and using the same methods as described above for the core 112 and the layer 114.

A liner or liners 152 may overlie the bottom member 140 as shown in FIGS. 3 and 4. The liner 152 may be formed of SiC or SiC coated graphite, for example, as disclosed in U.S. patent application Ser. No. 10/017,492, filed Oct. 20, 2001, the disclosure of which is incorporated herein by reference.

A platter 154 or the like may be situated between the bottom member 140 and the substrate 20 to support the substrate 20. According to some embodiments, the platter 154 may be rotatively driven by a suitable mechanism (not shown). For example, the system may include a gas-driven rotation system as described in Applicant's U.S. application Ser. No. 09/756,548, titled Gas Driven Rotation Apparatus and Method for Forming Silicon Carbide Layers, filed Jan. 8, 2001, and/or as described in Applicant's U.S. application Ser. No. 10/117,858, titled Gas Driven Planetary Rotation Apparatus and Methods for Forming Silicon Carbide Layers, filed Apr. 8, 2002, the disclosures of which are hereby incorporated herein by reference in their entireties. Alternatively, the platter 154 may be stationary. The platter 154 may be adapted to hold one or multiple substrates 20. The platter 154 may be formed of any suitable material such as SiC coated graphite, solid SiC or solid SiC alloy. The platter 154 may be omitted such that the substrate rests on the bottom member 140, the liner 152, or other suitable support.

In use, the process gas supply system 161 supplies a flow of the process gas to the reaction chamber 106 through the inlet opening 102. The process gas P flows generally in a flow direction R (FIG. 3). The arrows labeled P in FIG. 3 indicate the general flow path of the process gas and the reagents therein. As shown, the process gas and the reagents therein contact the substrate 20 to form the desired layer (e.g., an epilayer) on the exposed surface of the substrate 20.

Concurrently, the buffer gas supply system 171 supplies or inserts a flow of the buffer gas into the buffer gas region 106A of the reaction chamber 106 through the ports 176 such that the buffer gas B flows through the reaction chamber 106 generally in the flow direction R. The arrows labeled B in FIG. 3 indicate the general flow path of the flow of buffer gas. The buffer gas B flows in the buffer gas region 106A along the ceiling or interior surface 120 so as to form a barrier layer 178 of flowing buffer gas extending upwardly from the dashed line of FIG. 3 to the ceiling surface 120.

The barrier layer 178 serves to inhibit or impede the movement of the process gas P and components thereof from moving into contact with the ceiling surface 120 where reagents or reactants of the process gas P might otherwise form deposits. Below the barrier layer 178, the process gas P is permitted to flow in the normal manner to, over and beyond the substrate 20. In this manner, the process gas P and the deposition system 101 form the desired layer(s) on the exposed surface(s) of the substrate 20. The flow of buffer gas B may also serve to push the reactant stream of the process gas P toward the substrate 20, thereby accelerating the growth rate.

As discussed in more detail below, according to some embodiments, the buffer gas B flow is maintained as a substantially laminar flow. As long as the flow of the buffer gas B is laminar, the only way reagents or other components from the process gas P can reach the ceiling surface is by diffusing from the process gas P flow and through the barrier gas B flow. In general, the distance $S \approx \sqrt{Dt}$, diffusing species will traverse during time span of t follows the relationship $S \approx \sqrt{Dt}$, where D is the diffusion rate. In the present case, t is the transit time of species through the reaction chamber 106. The transit distance of concern will depend on to what lengthwise extent the operator or designer desires to inhibit deposits downstream of the process gas inlet 102B. In most cases, it will be deemed sufficient to inhibit or prevent the formation of deposits on the ceiling surface 120 up to the downstream edge of the substrate 20. In the susceptor assembly 100 illustrated in FIG. 3, this transit distance is indicated by the distance L. The transit time can generally be determined as follows:

$$t \approx \frac{L}{\left(\frac{M}{\rho A}\right)}$$

Where:
L=Length of susceptor
M=Mass flow rate
ρ=Average density of gas within susceptor, determined by pressure, temperature and gas composition.
A=Cross sectional area of susceptor opening.

In order for the barrier layer 178 to prevent all diffusion of the components of the process gas P, the thickness S of the barrier layer 178 (which may correspond generally to the height I of the step portion 116) should satisfy:

$$S \geq \sqrt{Dt} = \sqrt{\frac{DL}{\left(\frac{M}{\rho A}\right)}}$$

It will be appreciated by those of ordinary skill in the art upon reading the description herein that, in accordance with the present invention, it is not necessary to completely prevent all components of the process gas P from contacting the ceiling surface 120 as may be accomplished by providing fully laminar flow of the buffer gas B and a barrier layer 178 having a thickness S satisfying the foregoing criteria. Rather, the system 101 may be designed to allow some turbulence and/or have a barrier layer thickness S less than that necessary to preclude all deposits. In this manner, for example, the system 101 may provide a significant reduction in parasitic deposits while allowing some deposits to occur. According to some embodiments, the rate of formation of parasitic deposits on the ceiling surface 120 is preferably no more than one half the growth rate on the substrate 20 and more preferably no more than one quarter the growth rate on the substrate 20.

The barrier layer thickness S may be increased to provide an additional margin of protection for the ceiling surface 120 or to compensate for turbulence in the buffer gas flow B. The height of the buffer gas region 106A may be greater than, less than, or the same as the optimal thickness S of the barrier layer 178.

Further, various process parameters may be considered in determining the degree of laminarity of the buffer gas B flow and the distance S needed to obtain the desired reduction or prevention of deposits on the ceiling surface 120. For example, at typical SiC epilayer growth temperatures (i.e., in the range of about 1500 to 1800° C.), simultaneous etch and deposition processes may take place. Therefore, for a given growth condition, there may exist a critical minimum reagent supply rate necessary to stabilize the surface (in this case, the ceiling surface 120). A reagent supply rate above critical will result in growth of parasitic deposits on the ceiling surface 120 while a supply rate below critical will result in etching of parasitic deposits from the ceiling surface 120. Accordingly, even if the reagent flux to the ceiling were only reduced to the critical supply rate, then essentially no net deposition would occur on the ceiling.

Preferably, the deposition system 101 is adapted to maintain the flow of the buffer gas B and the flow of the process gas P as a laminar flow to at least a location downstream of the substrate 20, and more preferably, throughout the reaction chamber 106, to reduce or prevent mixing or turbulence between the flows that may promote transport of the process gas P through the barrier layer 178.

The relative dimensions and configurations of the reaction chamber 106, the process gas inlet 102B, and the buffer gas ports 176 may be selected to promote laminar flow. According to some embodiments and as illustrated (see FIGS. 3 and 4), the process gas inlet 102B is smaller in cross-section (i.e., generally perpendicular to the flow direction R of the gases, and as shown in FIG. 4) than the reaction chamber 106 so that a remaining space (i.e., the buffer gas region 106A) is available in the reaction chamber 106 for insertion of the buffer gas B into the reaction chamber 106 without inserting the buffer gas B into the process gas or into the unmodified flow path of the process gas P.

In the illustrated embodiment, the provision of the stepped portion 116 may facilitate laminar flow. According to some embodiments of the present invention, the sum of the height G of the opening 102 and the height I of the step portion 116 is substantially the same as the full height H of the reaction chamber 106 (see FIG. 3). Preferably, the widths of the process gas inlet 102B, the step portion 116, and the reaction chamber 106 are substantially the same so that the cross-sectional area (i.e., generally perpendicular to the flow direction R of the gases, and as shown in FIG. 4) of the reaction chamber 106 is substantially the same as the combined cross-sectional area of the process gas inlet 102B and the step portion 116. In this manner, the flow of the process gas P and the flow of the buffer gas B enter the reaction chamber 106, in parallel, at substantially the same axial location in the reaction chamber 106 along the direction of flow R of the gases P, B. Because the buffer gas region 106A is provided above the natural flow path of the process gas P, the buffer gas B can be inserted into the reaction chamber 106 without substantially displacing the process gas P. As a result, turbulence and mixing of the gas flows that might otherwise be created by initially introducing the buffer gas B into the path of the process gas P may be avoided. The height I of the step portion 116 is preferably between about 5 and 25% of the height H of the reaction chamber 106.

According to some embodiments and as illustrated, the reaction chamber 106 has a substantially uniform height H along substantially its full length. In this case, the reaction chamber 106 may have a substantially uniform cross-sectional area along its full length. This configuration may serve to promote the integrity of the boundary layer between the flow of the process gas P and the flow of the buffer gas B. The height H of the reaction chamber 106 is preferably between about 0.5 and 5 cm. According to further embodiments, the height H is not uniform, but rather the ceiling is tilted or curved in either direction to improve uniformity or efficiency of the process. In this case, the cross-sectional area of the reaction chamber 106 may vary, uniformly or non-uniformly.

While a step portion 116 and ports 176 are shown and described, other features and geometries may be used to control the flow of the buffer gas B so as to control turbulence in the flow of the buffer gas B. The configurations of the process gas inlet passage 102A, the process gas inlet 102B, the inlet opening 102, the buffer gas passages 117, and/or the buffer gas inlets 176 may be adapted to promote laminar flow of and between the process gas P and the buffer gas B. The axial length K (FIG. 3) of the process gas inlet passage 102A may be extended to reduce turbulence in the process gas P entering through the inlet 102 before the process gas P enters the reaction chamber 106 through the process gas inlet 102B. However, because the passage 102A is within the susceptor assembly 100 and is thus heated, reactions may occur which tend to form deposits or the ceiling surface of the passage 102A. For this reason, it may be desirable to minimize the length of the passage 102A. The buffer gas ports 176 may be replaced with one or more suitably configured slots.

According to some embodiments, the velocity of the process gas P and the velocity of the buffer gas B through the reaction chamber 106 are substantially the same. For SiC epitaxy, in accordance with some embodiments of the present invention where the length of the reaction chamber 106 is between about 0.1 and 1 m, the velocity of the gases P, B is at least about 1 m/s, and preferably between about 5 and 100 m/s to limit the time for diffusion of the process gas P through the barrier layer 178.

In order to further promote the integrity of the barrier layer 178 and thereby inhibit diffusion of the process gas P therethrough, the buffer gas B may be provided at a temperature greater than the temperature of the adjacent process gas P. The hotter buffer gas B will naturally segregate from the relatively cooler process gas P along the ceiling surface 120 because of the relative buoyancy of the hotter gas. According to some embodiments, the average temperature of the buffer gas B is at least 10° C. hotter than the average temperature of the process gas in the reaction chamber 106.

The buffer gas B may be heated using the heater 174. Additionally or alternatively, the buffer gas B may be heated by heating the ceiling surface 120 to a temperature greater than the temperature or temperatures of the lower surfaces contiguous with the reaction chamber 106 which the process gas P contacts, i.e., by providing a temperature differential between the ceiling surface 120 and the floor, the platter 154 and/or other surfaces contacting the process gas P. That is, the temperature profile in the reaction chamber 106 may be deliberately and selectively maintained as spatially non-uniform (e.g., as a gradient) extending from the ceiling surface 120 to the lower and/or other surfaces contiguous with the reaction chamber 106. This may be accomplished, for example, by providing greater thermal insulation between the core 142 and the surfaces of the liner 152, the platter 154 and the substrate 20 contacting the process gas P than is provided between the core 112 and the ceiling surface 120. For example, the liner 152 and the layer 114 may be suitably relatively constructed (e.g., by selection of material and thickness) to provide desired relative insulative effects. Because the top member 110 and the bottom member 140 are inductively heated, primarily by the resistivity of their graphite cores 112, 142, the temperatures of the surfaces of the liner 152, the platter 154 and the substrate 20 contacting the process gas P are thereby reduced as compared to the temperature of the ceiling surface 120. The buffer gas B is thus heated at a faster rate than the process gas P. To promote conduction of heat from the core 112 to the ceiling surface 120, the layer 114 may be directly coated on the core 112 to form a relatively monolithic or unitary top member 110.

Alternatively or additionally, a temperature differential can be created or increased between the ceiling surface 120 and the other surfaces such as the liner 152 or other lower surfaces by forming the layer 114 (and thus the ceiling surface 120) from a material having a lower emissivity than the material of the layer 144 and/or of the liner 152 or other surfaces contacting the process gas P stream. For example, the layer 114 may be formed of TaC (which has an emissivity of about 0.4) and the liner 152 and the platter 154 may be formed of SiC (which has an emissivity of about 0.9). As a result, the layer 114, and therefore the ceiling surface 120, will lose comparatively less heat from radiation, resulting in a higher temperature at the ceiling surface 120. Moreover, parasitic deposits may tend to adhere less well to TaC or other metal carbides than to SiC. As a further advantage, in many applications, a TaC coating will typically be more durable than a SiC coating, which may serve to prolong the service life of the part.

In addition to the barrier effect, the ceiling surface 120 can be heated, for example, in one or more of the manners described above, such that it is sufficiently hotter than the other components in the reaction chamber 106 to induce etching or sublimation of deposits on the ceiling surface 120. That is, deposits on the relatively hot ceiling surface 120 will tend to etch away or sublime and return to the buffer gas B or the process gas P rather than remaining on the ceiling surface 120.

As discussed above, the buffer gas B may consist of or include HCl or other active gas to chemically impede the formation of parasitic deposits on the ceiling surface 120 and/or to remove such deposits.

Because the growth of parasitic deposits on the ceiling surface 120 is inhibited or suppressed, greater volumes of process gas P can be flowed through the reaction chamber 106 before cleaning or the like is required. Deposition systems and methods in accordance with the present invention may greatly extend the permissible growth time and layer thickness while improving repeatability and efficiency. Moreover, the reduction in the rate of deposit formation may allow the use of lower ceiling heights, which allows for more efficient use of the process gas and improved thermal uniformity.

While the foregoing deposition system 101 and methods are described as relating to a horizontal, hot wall, CVD, flow through deposition process, various aspects of the present invention may be used in other types of deposition systems and processes. While particular embodiments have been described with reference to "top", "bottom" and the like, other orientations and configurations may be employed in accordance with the invention. For example, the deposition system and process may be a cold wall and/or non-horizontal flow through system and process. The deposition system and process may be a vapor phase epitaxy (VPE), liquid phase epitaxy (LPE), or plasma enhanced CVD (PECVD) deposition system and process rather than a CVD system or process. The present invention is not limited to providing a barrier layer for a ceiling surface of a reaction chamber. The buffer gas supply system may be modified to provide a buffer gas flow along one or more surfaces in addition to or instead of the ceiling surface. For example, the buffer gas supply system may be employed to inhibit parasitic deposits from forming on a lower liner or other surfaces upstream from the substrate 20, or in other locations where parasitic deposits are problematic.

While the systems and methods have been described in relation to processes for depositing layers on substrates such as semiconductor wafers, the present invention may be employed in processes for depositing layers or the like on other types of substrates. The systems and methods of the present invention may be particularly useful in processes for forming an epitaxial layer on a substrate.

Various other modifications may be made in accordance with the invention. For example, the reaction chamber may be closed at one or both ends rather than providing a through passage. Heating systems may be used other than or in addition to inductive heating.

As used herein a "system" may include one or multiple elements or features. In the claims that follow, the "deposition system", the "deposition control system", the "buffer gas supply system", the "process gas supply system" and the like are not limited to systems including all of the components, aspects, elements or features discussed above or corresponding components, aspects, elements or features.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A deposition system for depositing a film on a substrate, the deposition system comprising:
   a) a reaction chamber arranged and configured to receive the substrate and the process gas;
   b) an interior surface contiguous with the reaction chamber;
   c) a process gas supply system to supply a flow of the process gas to the reaction chamber;
   d) a buffer gas supply system arranged and configured to supply a flow of a buffer gas between the interior surface and at least a portion of the process gas and flowing in contact with the process gas such that the flow of the buffer gas forms a gas barrier layer to inhibit contact between the interior surface and components of the process gas when the process gas is disposed in the reaction chamber; and
   e) at least one susceptor member to heat the reaction chamber;
   wherein the system is arranged and configured to provide the buffer gas to the reaction chamber at a temperature greater than a temperature of the process gas in the reaction chamber.

2. The system of claim 1 wherein the buffer gas supply system is arranged and configured to flow the buffer gas along the interior surface.

3. The system of claim 1 including a process gas inlet to supply the process gas to the reaction chamber, wherein:
   the process gas inlet has a smaller cross-sectional area than a cross-sectional area of the reaction chamber so as to define a buffer gas region in the reaction chamber; and
   the buffer gas supply system is arranged and configured to flow the buffer gas into the buffer gas region.

4. The system of claim 1 wherein the interior surface is a ceiling surface of the reaction chamber.

5. The system of claim 1 wherein the buffer gas supply system is arranged and configured to heat the buffer gas before introducing the buffer gas into the reaction chamber.

6. The system of claim 1 wherein the system is arranged and configured to provide the buffer gas to the reaction chamber at an average temperature that is at least 10 degrees Celsius greater than an average temperature of the process gas in the reaction chamber.

7. The system of claim 1 arranged and configured to heat the buffer gas as the buffer gas flows along the interior surface.

8. The system of claim 1 including an electromagnetic frequency (EMF) generator operative to inductively heat the reaction chamber by generating electrical eddy currents in the at least one susceptor member, responsive to which the at least one susceptor member generates heat.

9. The system of claim 1 arranged and configured to heat the interior surface to a temperature sufficient to promote sublimation of parasitic deposits from the process gas that deposit on the interior surface.

10. The system of claim 1 wherein the buffer gas supply system is arranged and configured to flow the buffer gas through the reaction chamber at a velocity of at least about 1 m/s.

11. The system of claim 10 wherein the buffer gas supply system is arranged and configured to flow the buffer gas through the reaction chamber at a velocity of between about 5 and 100 m/s.

12. The system of claim 1 wherein the buffer gas supply system includes a supply of buffer gas.

13. The system of claim 12 wherein the buffer gas comprises a noble gas.

14. The system of claim 13 wherein the noble gas is selected from the group consisting of argon, helium, neon, krypton, radon, and xenon.

15. The system of claim 12 wherein the buffer gas comprises $H_2$, $N_2$, $NH_3$ and/or air.

16. The system of claim 12 wherein the buffer gas includes an active material capable of chemically inhibiting the deposition of parasitic deposits on the interior surface and/or removing parasitic deposits from the interior surface.

17. The system of claim 16 wherein the active material includes an etchant.

18. The system of claim 17 wherein the etchant includes at least one of HCl, $Cl_2$ and a carbon-containing gas.

19. The system of claim 1 wherein the system is a chemical vapor deposition (CVD) system.

20. The system of claim 19 wherein the system is a hotwall CVD system.

21. The system of claim 1 arranged and configured to heat the interior surface to a higher temperature than a second surface that is adapted to contact the process gas when the process gas is disposed in the reaction chamber.

22. The system of claim 21 wherein the second surface comprises a first material and the interior surface comprises a second material, the second material having a lower emissivity than the first material.

23. The system of claim 22 wherein the second surface is formed of SiC and the interior surface is formed of a metal carbide.

24. The system of claim 23 wherein the second surface is formed of at least one of TaC and NbC.

25. The system of claim 22 including an electromagnetic frequency (EMF) generator operative to inductively heat the reaction chamber by generating electrical eddy currents in the at least one susceptor member, responsive to which the at least one susceptor member generates heat, wherein the at least one susceptor member is responsive to the electrical eddy currents generated by the EMF generator to heat each of the interior surface and the second surface.

26. A deposition system for depositing a film on a substrate, the deposition system comprising:
- a) a reaction chamber arranged and configured to receive the substrate and the process gas;
- b) an interior surface contiguous with the reaction chamber;
- c) a process gas supply system to supply a flow of the process gas to the reaction chamber;
- d) a buffer gas supply system arranged and configured to supply a flow of a buffer gas between the interior surface and at least a portion of the process gas and flowing in contact with the process gas such that the flow of the buffer gas forms a gas barrier layer to inhibit contact between the interior surface and components of the process gas when the process gas is disposed in the reaction chamber;
- e) at least one susceptor member; and
- f) an electromagnetic frequency (EMF) generator operative to inductively heat the reaction chamber by generating electrical eddy currents in the at least one susceptor member, responsive to which the at least one susceptor member generates heat;

wherein the process gas supply system is arranged and configured to supply the flow of the process gas through the reaction chamber in a flow direction;

wherein the buffer gas supply system is arranged and configured to flow the buffer gas through the reaction chamber in the flow direction; and wherein the buffer gas supply system and the process gas supply system are arranged and configured to flow the buffer gas and the process gas through the reaction chamber at substantially the same velocity.

27. The system of claim 26 wherein:
the process gas supply system supplies the flow of the process gas through the reaction chamber in a flow direction that is substantially horizontal.

28. The system of claim 27 wherein the buffer gas supply system is arranged and configured to provide a substantially laminar flow of the buffer gas along the interior surface to at least a location downstream of the substrate.

29. A deposition system for depositing a film on a substrate, the deposition system comprising:
- a) a reaction chamber arranged and configured to receive the substrate and the process gas;
- b) an interior surface contiguous with the reaction chamber;
- c) a process gas supply system to supply a flow of the process gas to the reaction chamber;
- d) a buffer gas supply system arranged and configured to supply a flow of a buffer gas between the interior surface and at least a portion of the process gas and flowing in contact with the process gas such that the flow of the buffer gas forms a gas barrier layer to inhibit contact between the interior surface and components of the process gas when the process gas is disposed in the reaction chamber;
- e) at least one susceptor member; and
- f) an electromagnetic frequency (EMF) generator operative to inductively heat the reaction chamber by generating electrical eddy currents in the at least one susceptor member, responsive to which the at least one susceptor member generates heat;

wherein the buffer gas supply system is arranged and configured to provide a substantially laminar flow of the buffer gas along the interior surface to at least a location downstream of the substrate.

30. The system of claim 29 wherein the buffer gas supply system and the process gas supply system are arranged and configured to introduce both the buffer gas and the process gas into the reaction chamber at substantially the same location along the flow direction so as to inhibit turbulence in and between the buffer gas flow and the process gas flow.

31. A deposition system for depositing a film on a substrate using a process gas and a buffer gas each flowed in a flow direction, the deposition system comprising:
- a) a susceptor assembly comprising at least one susceptor member defining:
  a reaction chamber arranged and configured to receive the substrate and having a buffer gas region to receive the buffer gas, the reaction chamber having a first cross-sectional area perpendicular to the flow direction; and
  a process gas inlet having a second cross-sectional area perpendicular to the flow direction, the second cross-sectional area being less than the first cross-sectional area; and
  a buffer gas inlet adjacent the process gas inlet and arranged and configured to direct the buffer gas into the buffer gas region of the reaction chamber; and
- b) an electromagnetic frequency (EMF) generator operative to inductively heat the reaction chamber by generating electrical eddy currents in the at least one susceptor member, responsive to which the at least one susceptor member generates heat.

32. The deposition system of claim 31 wherein:
the buffer gas region has a third cross-sectional area perpendicular to the flow direction; and
the third cross-sectional area and the second cross-sectional area have a combined cross-sectional area that is substantially the same as the first cross-sectional area.

33. The deposition system of claim 31 wherein the at least one susceptor member includes a step portion and the buffer gas inlet is formed in the step portion.

34. The deposition system of claim 31 wherein the reaction chamber has a length extending along the flow direction and the cross-sectional area of the reaction chamber is substantially uniform along substantially the entirety of the length of the reaction chamber.

35. The deposition system of claim 31 wherein the reaction chamber has a length extending along the flow direction and the cross-sectional area of the reaction chamber is non-uniform along the length of the reaction chamber.

36. The deposition system of claim 31 wherein the system is arranged and configured to heat the interior surface to a temperature sufficient to promote sublimation of parasitic deposits from the process gas that deposit on the interior surface.

37. A deposition system for depositing a film on a substrate, the deposition system comprising:
- a) a reaction chamber arranged and configured to receive the substrate and the process gas;
- b) an interior surface contiguous with the reaction chamber;
- c) a process gas supply system to supply a flow of the process gas to the reaction chamber;
- d) a buffer gas supply system arranged and configured to supply a flow of a buffer gas between the interior surface and at least a portion of the process gas and flowing in contact with the process gas such that the flow of the buffer gas forms a gas barrier layer to inhibit contact between the interior surface and components of the process gas when the process gas is disposed in the reaction chamber; and e) at least one susceptor member to heat the reaction chamber;

wherein the buffer gas supply system includes a supply of the buffer gas and the buffer gas includes an active material capable of chemically inhibiting the deposition of parasitic deposits on the interior surface and/or removing parasitic deposits from the interior surface.

38. The system of claim 37 wherein the active material includes an etchant.

39. The system of claim 38 wherein the etchant includes at least one of HCl, $Cl_2$ and a carbon-containing gas.

40. The system of claim 37 including an electromagnetic frequency (EMF) generator operative to inductively heat the reaction chamber by generating electrical eddy currents in the at least one susceptor member, responsive to which the at least one susceptor member generates heat.

* * * * *

UNITED STATES PATENT AND TRADEMARK OFFICE
CERTIFICATE OF CORRECTION

| | |
|---|---|
| PATENT NO. | : 8,430,960 B2 |
| APPLICATION NO. | : 11/512800 |
| DATED | : April 30, 2013 |
| INVENTOR(S) | : Sumakeris et al. |

Page 1 of 1

It is certified that error appears in the above-identified patent and that said Letters Patent is hereby corrected as shown below:

In the Specification

Column 5, Lines 21 and 22: Please correct "a top member 110, a pair of side members 130, and a bottom member 140."
to read -- a top susceptor member 110, a pair of side susceptor members 130, and a bottom susceptor member 140. --

Signed and Sealed this
Tenth Day of September, 2013

Teresa Stanek Rea
*Acting Director of the United States Patent and Trademark Office*